United States Patent
Lesso

(10) Patent No.: US 8,824,703 B2
(45) Date of Patent: Sep. 2, 2014

(54) AMPLIFIER CIRCUIT

(75) Inventor: John Paul Lesso, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 699 days.

(21) Appl. No.: 12/991,190

(22) PCT Filed: May 7, 2009

(86) PCT No.: PCT/GB2009/050480
§ 371 (c)(1),
(2), (4) Date: Nov. 8, 2010

(87) PCT Pub. No.: WO2009/136202
PCT Pub. Date: Nov. 12, 2009

(65) Prior Publication Data
US 2011/0055877 A1    Mar. 3, 2011

(30) Foreign Application Priority Data
May 7, 2008    (GB) .................................... 0808297.6

(51) Int. Cl.
H03F 1/36    (2006.01)
H04R 3/02    (2006.01)
H03F 3/68    (2006.01)

(52) U.S. Cl.
USPC ................. 381/121; 381/93; 381/95; 381/96; 381/120

(58) Field of Classification Search
USPC ............. 381/93, 94.2–94.9, 120, 121, 95–96; 327/307; 330/2, 9, 290
See application file for complete search history.

(56) References Cited

U.S. PATENT DOCUMENTS

| | | | | |
|---|---|---|---|---|
| 4,264,832 A | * | 4/1981 | Furman | 327/67 |
| 5,243,344 A | * | 9/1993 | Koulopoulos et al. | 341/143 |
| 5,777,512 A | * | 7/1998 | Tripathi et al. | 330/207 A |
| 6,028,469 A | * | 2/2000 | Roither et al. | 327/362 |
| 6,034,569 A | | 3/2000 | Lan et al. | |
| 6,606,359 B1 | | 8/2003 | Nag et al. | |
| 6,654,467 B1 | * | 11/2003 | York et al. | 381/71.14 |
| 2002/0130696 A1 | * | 9/2002 | Yoshizawa | 327/307 |
| 2005/0017883 A1 | | 1/2005 | Lee | |
| 2005/0134374 A1 | | 6/2005 | Hench et al. | |
| 2006/0125555 A1 | * | 6/2006 | Watts | 330/10 |
| 2007/0296481 A1 | | 12/2007 | Hayakawa | |
| 2008/0130696 A1 | | 6/2008 | Shahine | |
| 2008/0211578 A1 | * | 9/2008 | Morishima | 330/251 |

FOREIGN PATENT DOCUMENTS

| | | |
|---|---|---|
| EP | 1 178 637 A1 | 2/2002 |
| WO | WO 01/65698 A1 | 9/2001 |
| WO | WO 02/080352 A1 | 10/2002 |

* cited by examiner

Primary Examiner — Duc Nguyen
Assistant Examiner — George Monikang
(74) Attorney, Agent, or Firm — Dickstein Shapiro LLP

(57) ABSTRACT

There is provided an audio amplifier circuit (200), comprising: an input, for receiving an input signal; an amplifier (205) for receiving a modified input signal and outputting an amplified signal; and a feedback loop (245) comprising digital circuitry for feeding back the amplified signal and combining a feedback signal with the input signal to generate the modified input signal. The feedback loop (245) comprises: a low-pass filter (220) for filtering the amplified signal; a comparator (225) for comparing the filtered signal with a threshold value and outputting a comparison signal; and an integrator (230) for integrating the comparison signal and outputting the feedback signal. According to another embodiment, the feedback loop comprises an integrator and a sigma-delta modulator.

33 Claims, 8 Drawing Sheets

AMPLIFIER CIRCUIT

The present invention relates to amplifiers, and in particular to an amplifier circuit and a method for reducing DC offset in an amplified signal.

BACKGROUND

FIG. 1 shows a dual-supply amplifier 10. The two supplies to the amplifier 10 are positive (+VDD) and negative (−VDD). An input signal is supplied to the amplifier 10 to be amplified, and the amplifier 10 outputs an output signal to a load 20.

One common problem with such amplifiers, when used in audio applications wherein the load is a speaker, is the presence of an audible 'pop' when the amplifier switches on or off. Such pops are caused by a DC offset in the signal output from the amplifier; that is, the speaker outputs a noise i.e. an audio artefact, when rising to or falling from the DC offset to ground during turn on and turn off. Not only are pops irritating to the end user of audio equipment, for example, their associated DC offset is also a cause of power wastage. This is particularly true for portable audio players, where power consumption is an important consideration in order to maximize battery life.

There are two main sources of DC offset in the output signal that may result in an audible artefact, i.e. a pop, being output to a speaker. One offset is inherent within the input signal, and the other offset is inherent within the amplifier itself.

In the amplifier 10 illustrated in FIG. 1, the input signal related offset is removed by using an AC coupling capacitor 30 i.e. a DC blocking capacitor. Such coupling capacitors are off-chip in integrated circuit audio circuits since they have large capacitance values, typically 2.2 μF, that are not realistically susceptible to integration due to the amount of area required to achieve such a high capacitance value. Thus, prior to the amplifier 10, a large-value capacitor 30 is placed in the playback, i.e. signal, path to prevent any DC component in the input signal from being input to and then output from the amplifier 10. This solution, however, requires pins for connecting the external AC blocking capacitor 30 to the integrated circuitry as well as associated "real estate", i.e. die area, on the chip. Two pins 32, 34 are required to connect the off-chip capacitor 30 to the on-chip circuitry. Most modern integrated circuits have stringent design constraints as to pin count, die area, package requirements, external components and the like, as such design parameters all add to system costs. Therefore, extra pins and external components are disadvantageous.

The amplifier 10 offset, and indeed any input signal offset, may be removed, or at least minimised, by using an analogue feedback circuit which acts to remove any undesired offset voltage at the input to the amplifier. The analogue feedback circuit is arranged to compare the amplifier output voltage to a target output bias, or reference, voltage and to feed back a corresponding voltage to be combined i.e. either added or subtracted, with the input signal. The realisation of low frequency time constants associated with audio applications requires the use of high resistor or capacitor values which for discrete solutions poses relatively minor problems. However, in order to realise an integrated analogue feedback circuit solution the use of high resistor and capacitor values is prohibitive due to area and process tolerance restraints.

SUMMARY OF THE INVENTION

According to a first aspect of the invention, there is provided an audio amplifier circuit, comprising: an input, for receiving an input signal; an amplifier for receiving a modified input signal and outputting an amplified signal; and a feedback loop comprising digital circuitry for feeding back the amplified signal and combining a feedback signal with the input signal to generate the modified input signal.

According to a further aspect of the present invention, there is provided an audio amplifier circuit comprising: a plurality of inputs, for receiving a plurality of input signals; a plurality of amplifiers, for receiving a corresponding plurality of modified input signals and outputting a corresponding plurality of amplified signals; and a feedback loop, multiplexed across the plurality of amplifiers, for receiving each of the plurality of amplified signals and combining a corresponding one of a plurality of feedback signals with a corresponding one of the plurality of input signals to generate the plurality of modified input signals. The feedback loop comprises: a low-pass filter for filtering a corresponding one of the plurality of amplified signals; a comparator for comparing the filtered signal with a threshold value and outputting a comparison signal; and an integrator for integrating the comparison signal and outputting a corresponding one of the plurality of feedback signals.

Corresponding methods are provided for the amplifier circuits detailed above.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION

One known solution to the problems described above is to provide an analogue feedback loop around the amplifier to correct for any DC offset. In this way both the offset associated with the input signal and the offset introduced by the amplifier can be corrected by the same mechanism. For example, analogue DC servo loops are known in the art. An analogue DC servo loop feeds back the output signal of an amplifier by filtering the output signal, generating a compensating DC signal, and then adding the compensating signal to the input to the amplifier.

Figure 1:
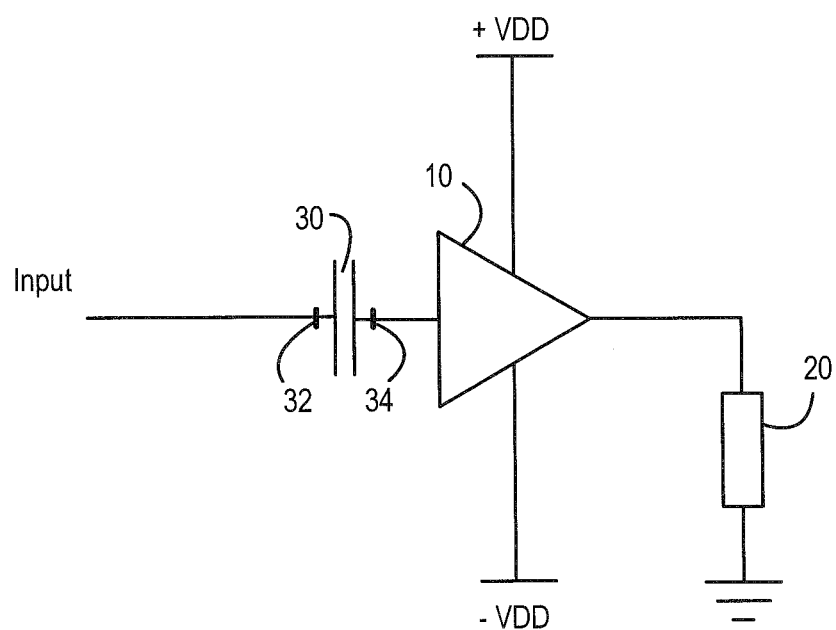
FIG. 1 shows an amplifier circuit.
Figure 2:
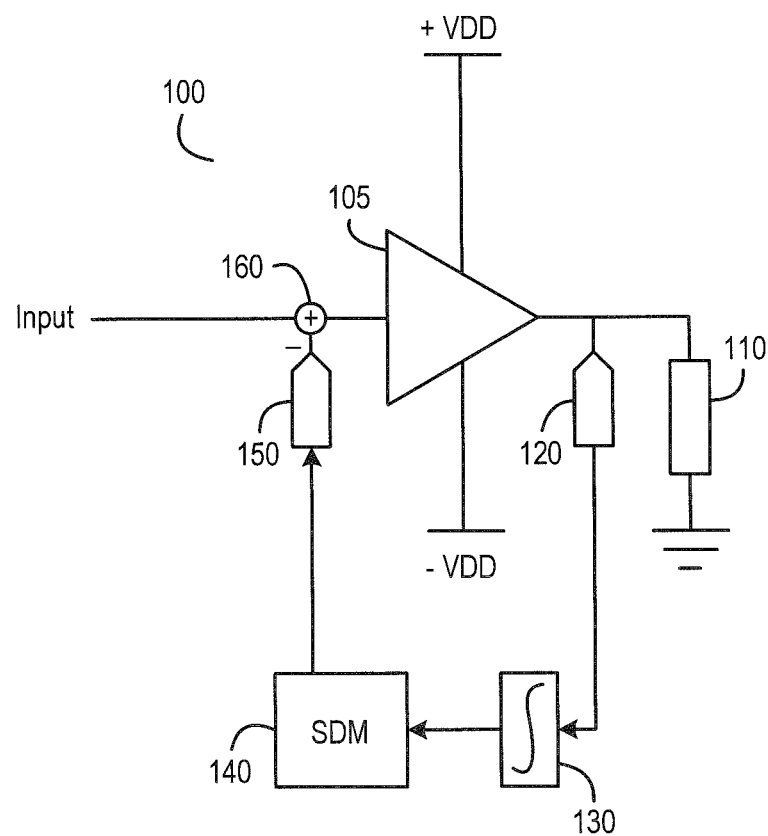
FIG. 2 shows an audio amplifier circuit according to a first aspect of the present invention.

FIG. 2 shows an audio amplifier circuit 100 according to a first aspect of the present invention, comprising a dual-supply amplifier 105 with a DC servo loop.

The audio amplifier 105 receives an input signal to be amplified, and outputs the amplified signal through a load 110. A DC servo loop samples the output signal from the amplifier 105 and converts the sampled output signal into a digital signal using an analogue-to-digital converter (ADC) 120. The digital sampled output signal is fed to an integrator 130, where it is integrated.

To achieve a low bandwidth within the feedback loop, a larger number of bits are required to be output by the integrator 130, for example 30 bits. However, the integrated signal must be recombined with the input signal, which in most cases will be analogue, and therefore the integrated signal must be converted into an analogue signal before being combined. Designing a 30-bit digital-to-analogue converter (DAC) is a very difficult task. One way to overcome the difficulty associated with designing a 30-bit DAC is to employ a sigma-delta modulator (SDM) 140. The SDM 140 operates by receiving a highly accurate input signal (e.g. 30 bits), and then outputting a signal with a reduced number of bits that is modulated in such a way, such as by pulse density modulation (PDM) for example, so as to behave with high accuracy i.e. like a 30-bit signal for example. Thus, the SDM 140 outputs an instantaneously less accurate output signal value, by using 6 bits for example, that nonetheless averages over time to the accurate input signal. The SDM 140 therefore reduces the word length of the integrated feedback signal to a relatively low number of bits, for example, 6 bits. The 6-bit digital feedback signal is converted to an equivalent analogue signal by a DAC 150, and this equivalent analogue signal is then subtracted from the analogue input signal in an adding element 160, to compensate for the DC offset.

Thus according to the embodiment described above, there is provided an audio amplifier circuit for amplifying an analogue audio signal, wherein the audio amplifier circuit comprises a digital feedback loop. The digital feedback loop comprises an integrator 130 and a word-length-reduction stage, such as a sigma-delta modulator (SDM) 140

However, in the embodiment of FIG. 2, the SDM 140 must operate continuously in order to generate an accurate representation of the integrated signal. That is, the output of the SDM 140 time averages to the accurate signal; it must therefore be run continuously to generate such an accurate time average. This consumes power at a relatively high level as long as the amplifier is switched on, which is disadvantageous.

Further, an audio system will likely have several outputs (e.g. left, right speakers, etc). The need for a SDM in the DC servo loop therefore means that a separate DC servo loop must be provided for each output path, occupying space on a chip that would otherwise be saved.

Figure 3A:
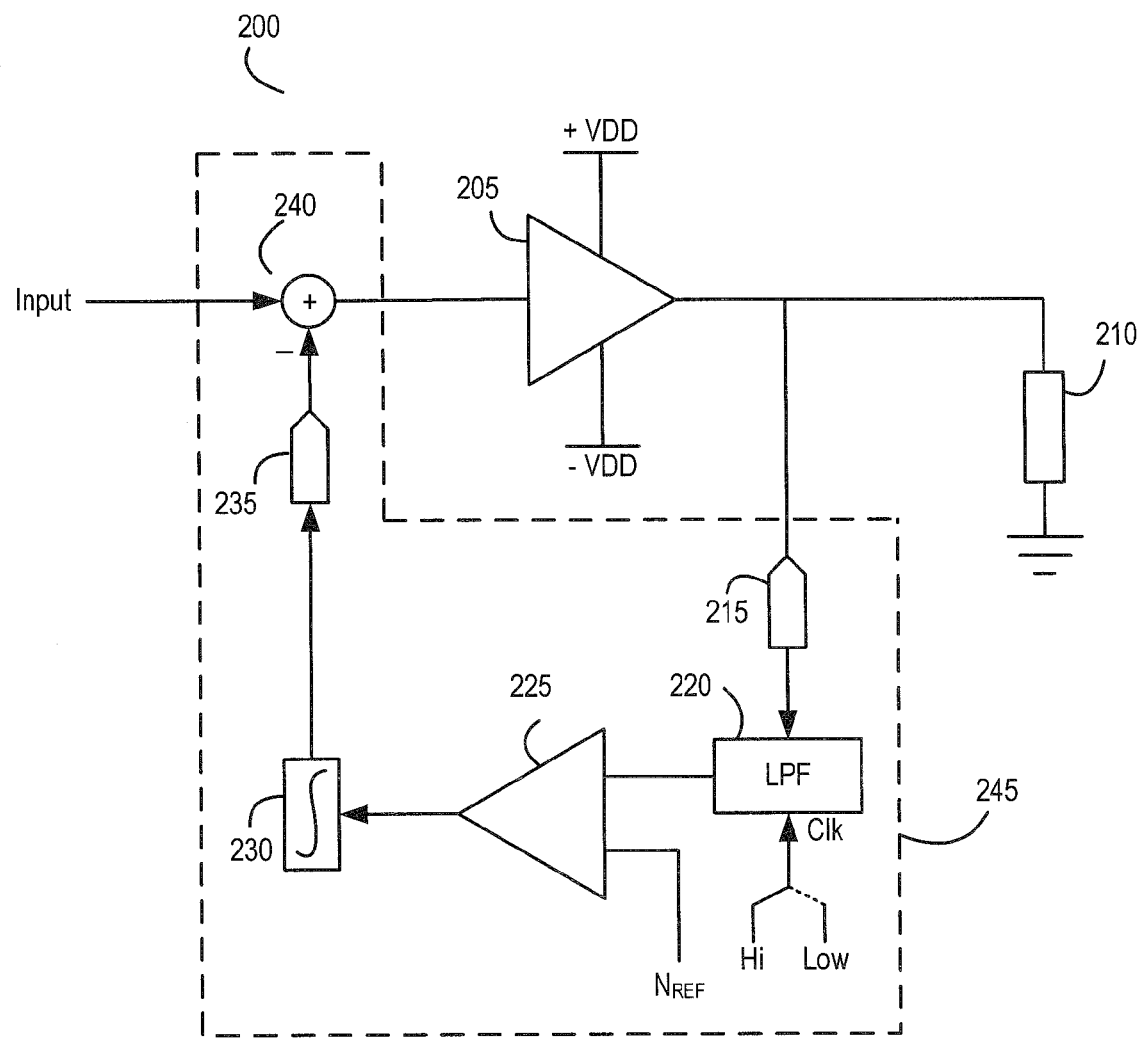
FIG. 3a shows an audio amplifier circuit according to another aspect of the present invention.

FIG. 3*a* shows an amplifier circuit 200 according to a further aspect of the present invention.

The audio amplifier circuit 200 comprises an audio amplifier 205 which receives an input signal to be amplified and output through a load 210. A feedback loop is provided across the audio amplifier 205 in order to correct for DC offset in the amplified signal. Thus the amplified signal output from the amplifier 205 is fed through an ADC 215 and converted into a digital signal. The digital signal is passed through a low-pass filter 220, and the filtered signal passed to a comparator 225. The low-pass filter 220 operates according to a clock signal, which may have a relatively high or a relatively low frequency. Alternatively, the clock signal may have a range of frequencies that are controllable as described in greater detail below. The comparator 225 compares the filtered signal with a reference $N_{REF}$ and outputs a comparison signal. The comparison signal is integrated in an integrator 230. The integrated signal is converted into an analogue signal using a DAC 235, and the analogue feedback signal is subtracted from the input signal in an adding element 240.

For simplicity in the following description, reference will be made to a feedback block 245 comprising the ADC 215, the low-pass filter 220, the comparator 225, the integrator 230 and the DAC 235 as described above.

The action of the feedback loop in FIG. 3*a* is to force the DC offset in the amplified signal to be equal to $N_{REF}$, a numerical representation of the target DC offset. Therefore, in order to minimize DC offset, $N_{REF}$ may be zero. If an alternative offset is required, $N_{REF}$ may be set appropriately, as would be apparent to those skilled in the art.

Figure 3B:
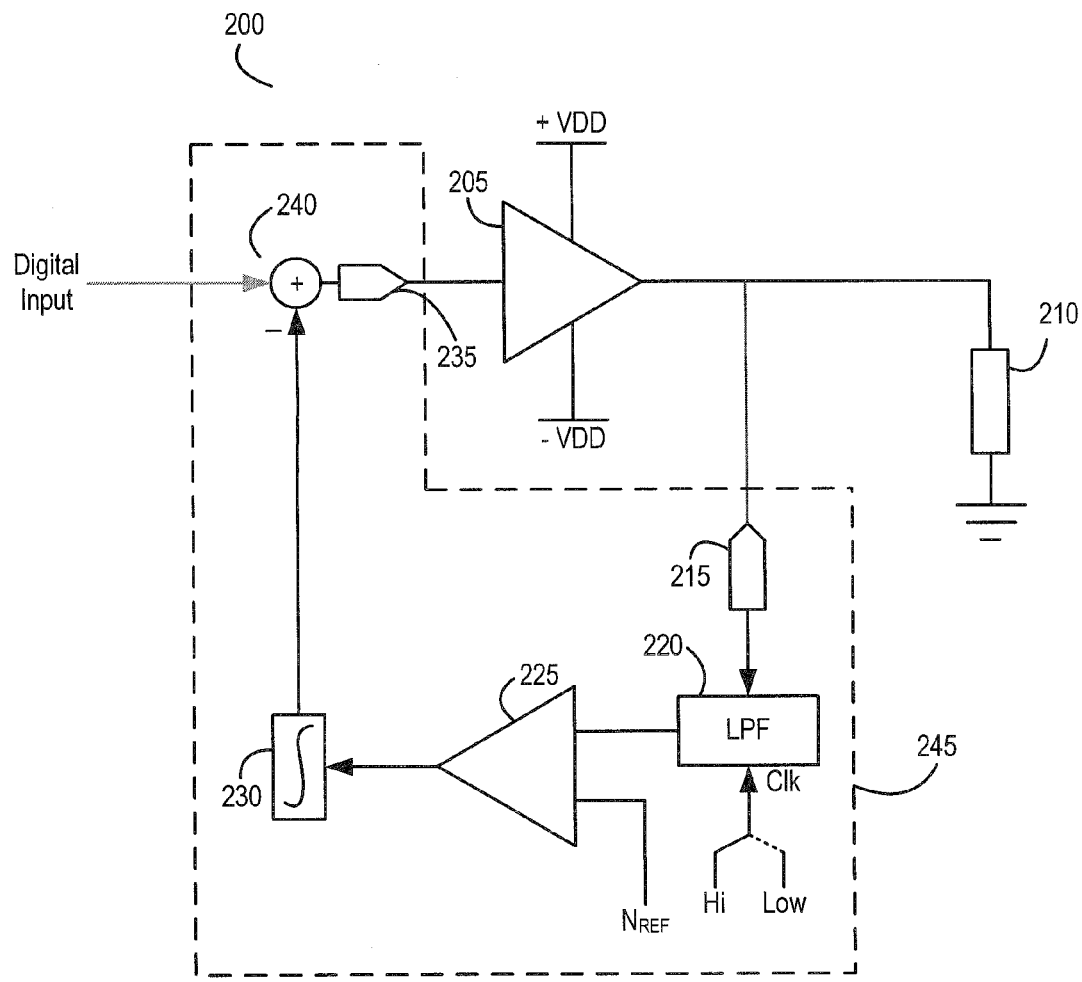
FIG. 3b shows an audio amplifier circuit according to another embodiment of the present invention.

Further alterations to the circuit 200 may be made without substantially affecting its operation. For example, FIG. 3*b* shows an arrangement whereby the audio signal is received in digital format. In this scenario, the output of the integrator 230 in the feedback loop 245 may be combined directly with the incoming digital audio signal, and then passed through a DAC 235 in the signal path.

Alternatively, the ADC 215 and the DAC 235 may be in the playback path of the circuit 200, rather than in the feedback loop. That is, the input signal may be input to an ADC, and then added to a digital feedback signal. This combined signal may then be input to a DAC and converted to analogue prior to being amplified. Likewise, the output of the amplifier may be converted to digital in an ADC before being fed back via the feedback loop; after the tap for the feedback loop, the signal may be converted back to analogue in a DAC before being driven to the load 210.

The audio amplifier circuit 200 described with respect to FIGS. 3*a* and 3*b* has many advantages over the amplifier circuit 100 described with respect to the embodiment of FIG. 2. For example, the absence of a sigma-delta modulator means that the feedback loop can be run until the correct compensation signal has been reached, and then disconnected. That is, once the integrated signal output from the integrator 230 has reached the correct and stable value to compensate for the DC offset, this value can be latched and continuously combined with the input signal via the ADC 235 and the adding element 240. The ADC 215 may be disconnected from the output of the audio amplifier 205, and the ADC 215, the low-pass filter 220, the comparator 225 and the integrator 230 may all be powered down, saving on power consumption of the circuit 200. In this manner the feedback loop can be dynamically powered on and off. Alternatively, the clock signal supplied to the low-pass filter 220 may be stopped, preventing the low-pass filter 220 from outputting further signals to the comparator 225.

A further advantage of the present invention is that various elements of the feedback loop may be multiplexed across multiple output playback paths. That is, most audio systems comprise a plurality of outputs, and therefore a plurality of amplifier circuits (i.e. one amplifier circuit for each output). However, the feedback loop according to the present invention may be multiplexed across the different outputs of the audio system; that is, one feedback loop may be provided for a plurality of amplifier circuits. This aspect will be described in greater detail with reference to FIG. 5, below.

Of course, it is desirable that the operation of the feedback loop should not interfere with the signal output to the load 210. For example, in audio applications, if the feedback loop were operating at maximum capacity during playback of an audio stream, the high bandwidth of the feedback loop would degrade the audio output signal of the audio amplifier circuit.

One method of operation that overcomes this problem is to operate the feedback loop at maximum, or relatively high, bandwidth when the amplifier circuit is first switched on, and thereafter operating the feedback loop at a reduced bandwidth. For example, when the system is first switched on, the low-pass filter may be clocked at a rate of 100 kHz. This allows the compensation signal generated by the feedback loop to quickly converge to the correct value. Thereafter, the low-pass filter may be clocked at a lower rate of, for example, 10 Hz.

This is advantageous in audio systems, for example, because normally audio playback will not begin immediately after the audio system is switched on. Therefore, the feedback loop can reach the correct value before actual playback begins.

Further, such an operation may also take place when the amplifier circuit is switched off, to prevent pops when the speaker falls to ground from any DC offset. Thus, when the circuit 200 receives an indication that the device is to be switched off, the low-pass filter 220 may be clocked at the higher rate to ensure that the compensation signal generated by the feedback block 245 is accurate.

In an embodiment, during the low-frequency phase, the amount of correction to the compensation signal may be limited to a certain, relatively low, rate of correction, to avoid jumps in the output signal. For example, the correction to the compensation signal may be limited to one least-significant bit per second. In this way, the output signal may be gradually corrected without any changes being noticeable to the end user. By correcting the DC offset during playback, power-off pops can also be prevented when the system is switched off.

A further problem in audio applications is the presence of a preamplifier with a variable gain controlled by a volume signal. An advantage of the amplifier circuit 200 described with respect to FIGS. 3a and 3b is that the feedback loop can effectively be powered down once the compensation signal has reached the correct value. However, alteration of the volume signal will affect the offset in the input signal to the amplifier circuit 200, and therefore the compensation value will no longer be correct.

Figure 3C:
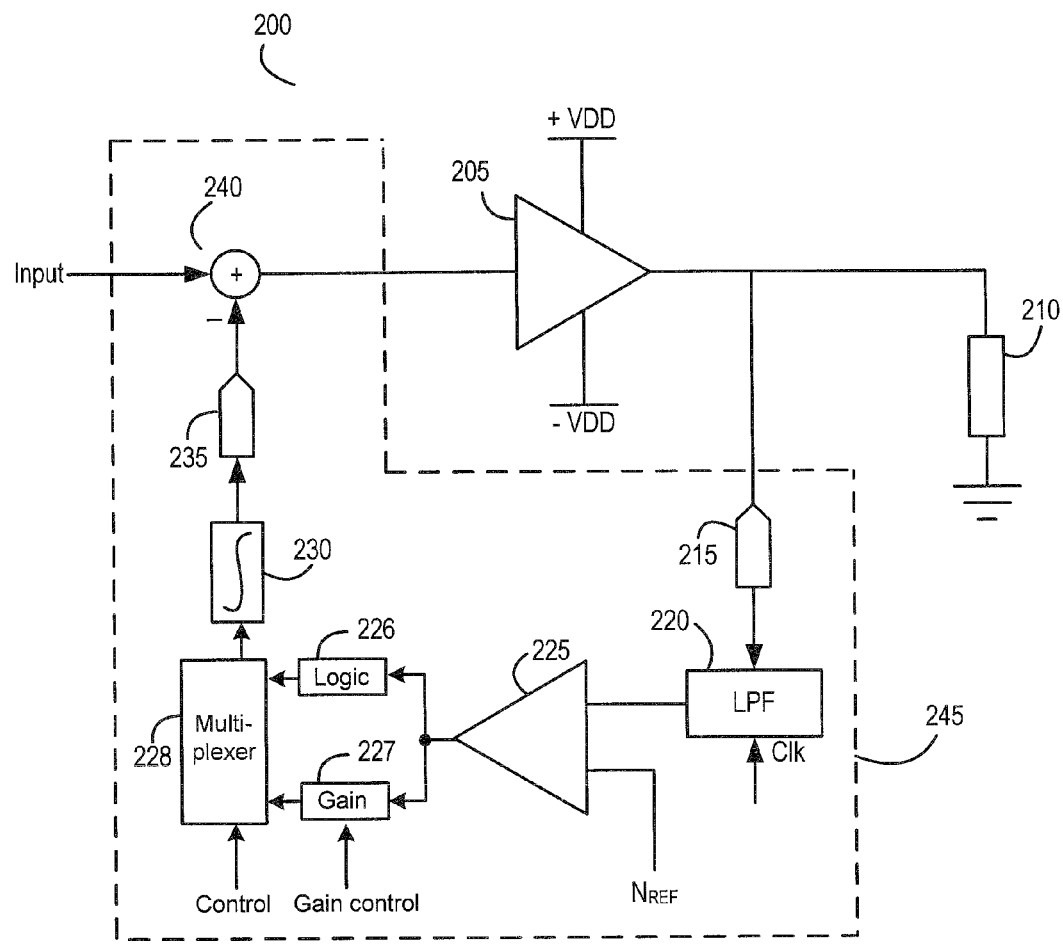
FIG. 3c shows an audio amplifier circuit according to a further embodiment of the present invention.

FIG. 3c shows a further audio amplifier circuit according to an embodiment of the present invention.

The audio amplifier circuit is similar to that described with respect to FIG. 3a, but comprises a number of features that enable the feedback loop to be operated at different frequencies and with different bandwidth according to a number of control signals provided to it.

The low-pass filter 220 receives a clock signal that may be varied to one of a number of different frequencies. By varying the clock frequency of the LPF 220, the speed with which the feedback loop converges to the correct offset value may be altered. That is, the feedback loop is operable in one of a plurality of modes, each mode corresponding to a clock frequency; one of the modes may correspond to zero frequency, i.e. where the clock signal is switched off, and the feedback loop is effectively held constant at a single correction value.

The feedback loop further comprises logic circuitry 226 and a gain stage 227 connected in parallel to the output of the comparator 225. The respective outputs of the logic circuitry 226 and the gain stage 227 are input to a multiplexer 228, which outputs a signal to the integrator 230.

As described previously, the comparator 225 outputs a comparison signal depending on whether the output of the low-pass filter 220 is higher or lower than a threshold value $N_{REF}$. The output is typically a low number of bits, and may be a single bit, i.e. indicating whether the output of the low-pass filter 220 is higher or lower (or equal) to the threshold value $N_{REF}$.

The logic circuitry 226 receives the comparison signal and performs a binary search. That is, for each clock iteration, the logic circuitry 226 outputs one of a plurality of signals having a binary value. In the next iteration, if the comparison signal indicates the DC offset is too high, the logic circuitry 226 outputs a signal half the size of the previous signal (e.g. the most significant bit is altered). If the comparison now says the DC offset is too low, the logic circuitry 226 knows that the correct value is somewhere between its previous two guesses. The circuitry 226 can continue in this way until the correct value is reached.

The gain stage 227 also receives the comparison signal and applies a gain to it. The gain stage receives a gain control signal that adapts the size of the applied gain. By increasing the gain, the feedback loop will converge more quickly to the correct offset value (i.e. it will take bigger 'steps' towards the correct value); however, a large gain also increases the likelihood that the feedback loop will overshoot the correct value. Therefore, the gain control signal may be adapted such that it is initially large (in which case the feedback loop converges rapidly to the correct offset value), but is then reduced (so that the feedback loop does not overshoot the correct offset value and only takes small steps towards it). Thus, in a first mode, the gain stage 227 applies a first gain that may be relatively high, and in a second mode the gain stage 227 applies a second gain that may be relatively low.

The outputs of both logic circuitry 226 and the gain stage 227 are received by a multiplexer, which also receives a control signal. A binary search is a rapid and effective means to converge to the correct offset value. However, it also generates a relatively large amount of noise due to the fluctuations in the offset value. The gain stage generates less noise due to the adaptability of the applied gain as described above, but converges less quickly to the correct offset value. Therefore, in one embodiment, the control signal is adapted such that in one mode the binary search is applied, and in another mode the gain stage is applied instead of the binary search. The binary search may be employed, for example, where noise is less important, such as on start-up of the audio amplifier circuit 200.

It is noted that although the embodiment of FIG. 3c shows an arrangement comprising logic circuitry 226 and a gain stage 227 which can be used selectively, the present invention also covers an embodiment whereby only the logic circuitry 226 or the gain stage 227 is provided for increasing the speed at which the feedback loop converges. It will be appreciated that such an embodiment removes the need for the multiplexer 228.

Figure 3D:
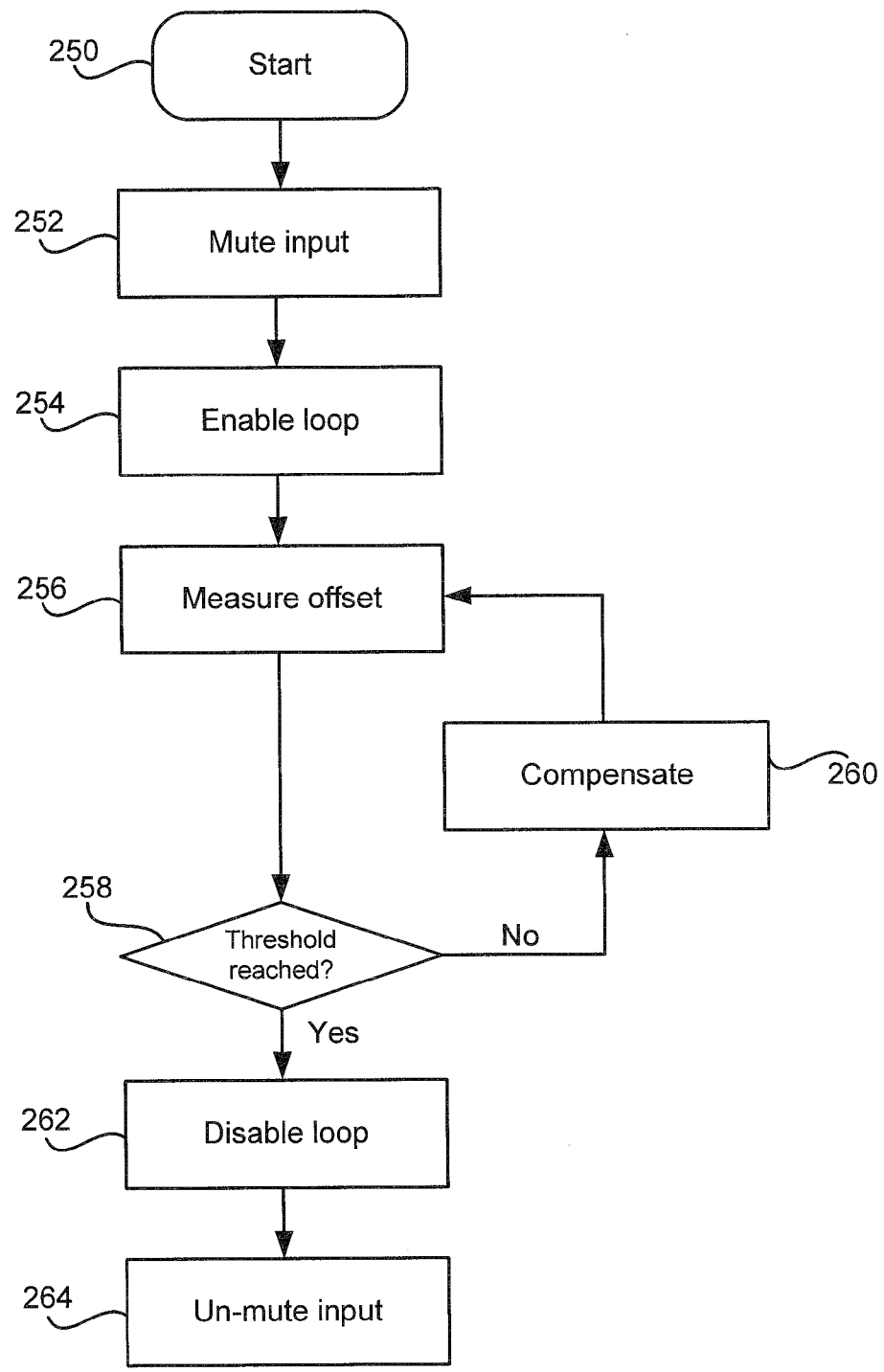
FIG. 3d shows a flowchart of a method according to an embodiment of the present invention.

FIG. 3d is a flowchart of a method in an audio amplifier circuit, in accordance with an embodiment of the present invention. The method may be employed, for example, on start-up of the audio amplifier circuit.

The method starts in step 250. In step 252, the input signal is muted. This may be achieved, for example, by appropriate preamplification or by simply disconnecting the input signal.

In step 254, the feedback loop is enabled. This may be achieved by applying a clock signal to the low-pass filter 220. The frequency of the clock signal affects the speed with which the feedback loop converges to the correct offset value.

In step 256, the DC offset is measured across the amplifier. This is achieved by connecting the feedback loop to the output of the amplifier.

In step 258, the offset is compared with a threshold value. This is achieved, for example, by using a comparator. If the threshold has not been reached, in step 260 the feedback loop is compensated appropriately to produce the desired offset. This may be by increasing or decreasing the offset depending on the measurement in step 258. The compensation may be achieved for example by using a binary search, or by applying a gain to the output of the comparator and integrating.

If the threshold has been reached, in step 262 the loop is disabled, for example by disconnecting the loop from the input and/or output of the amplifier or by applying a zero clock signal to the low-pass filter 220.

In step 264 the input signal is un-muted, and the method completes.

Figure 4:
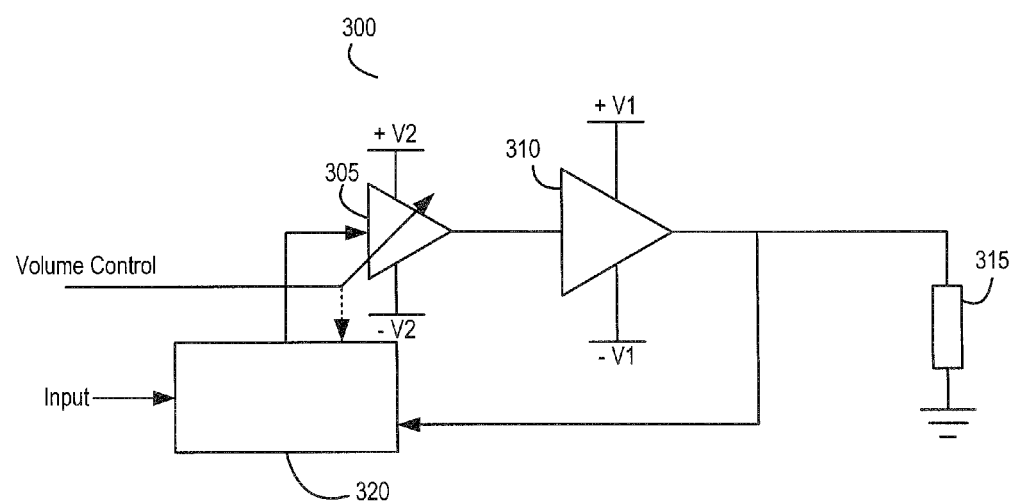
FIG. 4 shows an audio amplifier circuit according to a yet further embodiment of the present invention.

FIG. 4 shows a further audio amplifier circuit 300 according to the present invention.

The audio amplifier circuit 300 comprises two amplifiers: a preamplifier 305, having supply voltages +V2 and −V2; and a power amplifier 310, having supply voltages +V1 and −V1. The preamplifier 305 receives a modified input signal and amplifies the modified input signal according to a received volume control signal. Typically, the amplification in the preamplifier 305 will be an attenuation, although this may not always be the case. The preamplifier 305 outputs a signal to the power amplifier 310, which amplifies the signal and outputs to a load 315.

The signal output from the power amplifier 310 is further input to a feedback block 320. The feedback block 320 also receives an input signal to be amplified, and has the same structure as the feedback block 245 described above with respect to FIGS. 3a and 3b. That is, the signal output from the power amplifier 310 is fed through an ADC, a low-pass filter, a comparator, an integrator and a DAC, before being added to the input signal to generate the modified input signal (i.e. a signal where the DC offset has been compensated for).

In this embodiment, the volume control signal is also input to the feedback block 320, and used to control its operation, for example by altering the clock frequency of the low-pass filter. Thus, in one embodiment, when the volume control signal alters (i.e. there is a change in the volume), the low-pass filter is clocked at a higher frequency, so that the feedback block 320 can rapidly converge on a compensating signal with the new value required to compensate for the new DC offset. However, alternative arrangements may be thought of without departing from the present invention. For example, a register bit may be set and accessed by a control system. If the volume has been changed, the feedback loop can be controlled to operate at a higher frequency.

Of course, if the feedback block 320 is switched off for any reason, the action of the volume control signal change may cause the feedback block 320 to begin operating again.

In an alternative embodiment to that illustrated in FIG. 4, the feedback block 320 receives the signal output from the preamplifier 305, rather than that output from the power amplifier 310. This is a suboptimal solution, as it does not take into account offsets introduced by the power amplifier 310, but may suffice for certain applications where quality requirements are lower.

Figure 5:
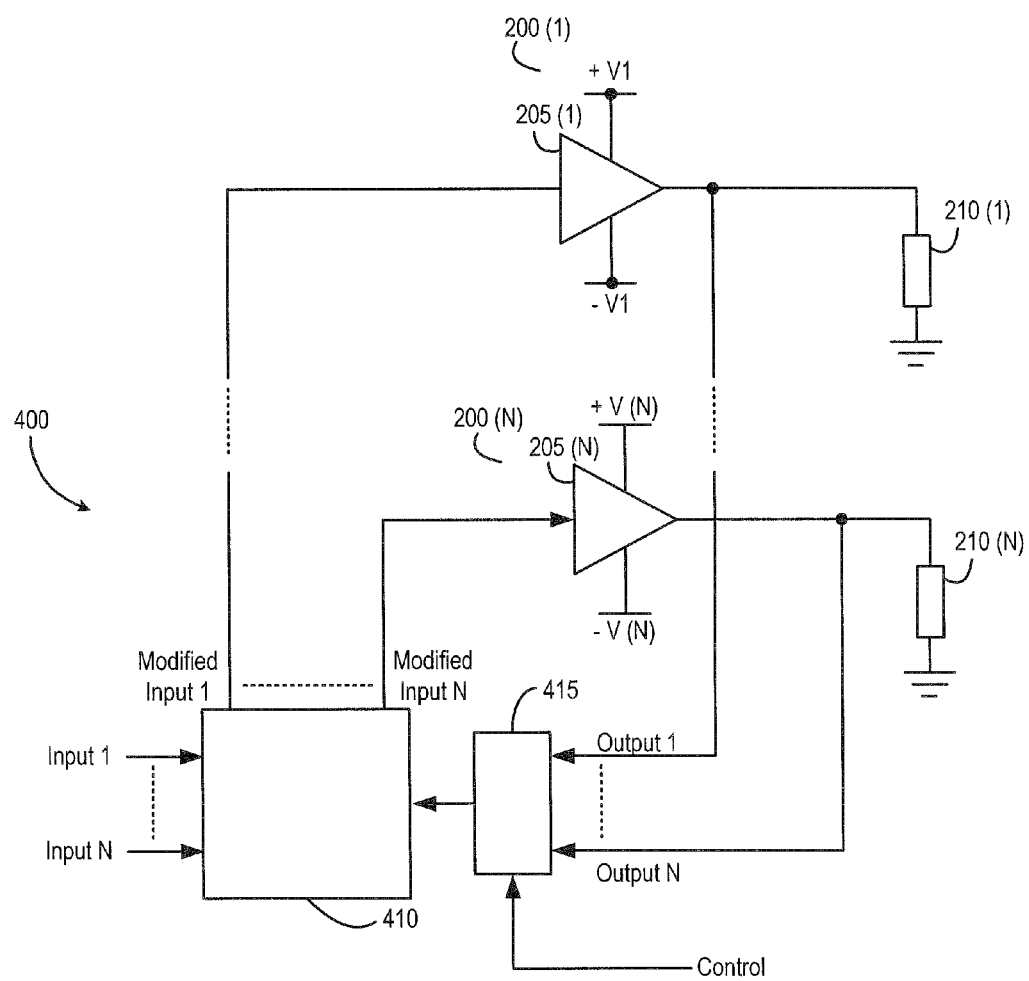
FIG. 5 shows a circuit according to the present invention comprising a plurality of audio amplifier circuits.

As mentioned above, an advantage of the present invention is that the feedback block may be multiplexed across more than one amplifier circuit. FIG. 5 shows a circuit 400 according to the present invention which takes advantage of this feature.

The circuit 400 comprises N amplifier circuits 200(1), 200(N), where N is an integer and is greater than or equal to 2. In the illustrated embodiment, each of the N amplifier circuits 200(N) comprises a respective power amplifier 205(N), each having supply voltages +V(N) and −V(N), which respectively receives a modified input signal Input 1-Input N. Each of the power amplifiers 205(N) outputs an output signal to a respective load 210(N).

The circuit 400 receives N respective input signals for each of the N amplifier circuits 200(N). The N input signals are fed to a feedback block 410. Further, each of the signals output from the respective amplifiers 205(N) is fed to a multiplexor 415. The multiplexor 415 time-multiplexes between the N output signals, such that a single output signal is fed to the feedback block 410 at any one time. A control signal controls the multiplexor 415.

The feedback block 410 itself is similar to the feedback block 245 described with respect to FIGS. 3a and 3b, but further comprises N latches for latching each of the N respective compensating signals as described below, and N respective adding elements 240 (not illustrated). Each of the input signals is input to a respective adding element, which also receives a respective compensating signal. The combination of the input signal and the compensating signal generates each of the respective modified input signals.

At any one time, the feedback block 410 receives the output signal from an amplifier 205(N). The output signal is fed through an ADC, a low-pass filter, a comparator, an integrator and a DAC as described with respect to FIGS. 3a and 3b, before being added to the input signal in a respective adding element. When the compensating signal has reached a stable, correct value, the output of the DAC is latched, or otherwise stored such that it can be continuously added to the respective adding element, even when the multiplexor is outputting an output signal from a different amplifier.

In this way, one feedback block 410 can generate compensating signals for each of a plurality of amplifier circuits 200(N). Of course, although only amplifier circuits 200(N) having a single amplifier are shown, any or all of the amplifier circuits 200(N) may have more than one amplifier, for example, a preamplifier and a power amplifier as described above with respect to FIG. 4.

There is thus described an amplifier circuit and a corresponding method for compensating for DC offset in an amplifier.

The amplifiers described herein are preferably incorporated in an integrated circuit. For example, the integrated circuit may be part of an audio and/or video system, such as an MP3 player, a mobile phone, a camera or a satellite navigation system, and the system can be portable (such as a battery-powered handheld system) or can be mains-powered (such as a hi-fi system or a television receiver) or can be an in-car, in-train, or in-plane entertainment system. Further to the signals identified above, the signals amplified in the amplifier may represent ambient noise for use in a noise cancellation process.

The skilled person will recognise that some or all of the above-described apparatus and methods may be embodied as processor control code, for example on a carrier medium such as a disk, CD- or DVD-ROM, programmed memory such as read only memory (firmware), or on a data carrier such as an optical or electrical signal carrier. For many applications, embodiments of the invention will be implemented on a DSP (digital signal processor), ASIC (application specific integrated circuit) or FPGA (field programmable gate array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (very high speed integrated circuit hardware description language). As the skilled person will appreciate, the code may be distributed between a plurality of coupled components in communication with one another. Where appropriate, the embodiments may also be implemented using code running on a field-(re-)programmable analogue array or similar device in order to configure analogue/digital hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An audio amplifier circuit, comprising:
   an input, for receiving an input signal;
   an amplifier for receiving a modified input signal and outputting an amplified signal; and
   a feedback loop comprising digital circuitry for feeding back the amplified signal and combining a feedback signal with the input signal to generate the modified input signal;
   wherein said feedback loop comprises:
      an analog to digital converter;
      a digital low-pass filter for filtering the digital signal received from the analog to digital converter;
      a digital comparator for comparing the filtered digital signal with a predetermined threshold value and outputting a comparison signal, wherein said predetermined threshold value represents a target DC offset value; and
      digital integrator for integrating the comparison signal;
      wherein the feedback signal is based on the output of the integrator.

2. An audio amplifier circuit as claimed in claim 1, wherein the feedback loop comprises an adaptive gain stage, for receiving the comparison signal and outputting to the integrator.

3. An audio amplifier circuit as claimed in claim 1, further comprising latching means for latching the feedback signal.

4. An audio amplifier circuit as claimed in claim 1, wherein the feedback loop operates in one of a first mode and a second mode.

5. An audio amplifier circuit as claimed in claim 4, wherein the first mode is a power-up mode when the amplifier circuit is initially powered on.

6. An audio amplifier circuit as claimed in claim 4, wherein the second mode is a playback mode.

7. An audio amplifier circuit as claimed in claim 4, further comprising:
   a preamplifier for receiving the modified input signal and outputting a preamplified signal to the power amplifier, in accordance with a volume signal; and
   means for determining when the volume signal changes, wherein the feedback loop operates in the first mode when the volume signal changes.

8. An audio amplifier circuit as claimed in claim 4, wherein the feedback loop operates at a first frequency in the first mode and at a second frequency in the second mode.

9. An audio amplifier circuit as claimed in claim 8, wherein the low-pass filter is clocked at said first frequency in the first mode and at said second frequency in the second mode.

10. An audio amplifier circuit as claimed in claim 8, wherein the first frequency is higher than the second frequency.

11. An audio amplifier circuit as claimed in claim 4, wherein the feedback loop is powered on in the first mode and powered down in the second mode.

12. An audio amplifier circuit as claimed in claim 4, wherein the feedback loop is connected to the amplifier circuit in the first mode and disconnected from the amplifier circuit in the second mode.

13. An audio amplifier circuit as claimed in claim 4 wherein the feedback loop comprises an adaptive gain stage, for receiving the comparison signal and outputting to the integrator, wherein the adaptive gain stage is configured to apply a first gain in the first mode, and a second gain in the second mode.

14. An audio amplifier circuit as claimed in claim 1, wherein the feedback loop comprises logic circuitry configured to perform a binary search to generate said feedback signal.

15. An audio amplifier circuit as claimed in claim 14, wherein the feedback loop comprises an adaptive gain stage, for receiving the comparison signal and outputting to the integrator and wherein in a first mode the feedback loop is configured to operate with said adaptive gain stage to generate the feedback signal, and wherein in a second mode the feedback loop is configured to operate with said logic circuitry to generate said feedback signal.

16. An integrated circuit, comprising:
    an audio amplifier circuit as claimed in claim 1.

17. An audio system, comprising an integrated circuit as claimed in claim 16.

18. An audio system as claimed in claim 17, wherein the audio system is a portable device.

19. An audio system as claimed in claim 17, wherein the audio system is a mains-powered device.

20. An audio system as claimed in claim 17, wherein the audio system is an in-car, in-train, or in-plane entertainment system.

21. An audio system as claimed in claim 17, wherein the input digital signal is representative of ambient noise for use in a noise-cancellation process.

22. A video system, comprising an integrated circuit as claimed in claim 16.

23. A video system as claimed in claim 22, wherein the video system is a portable device.

24. A video system as claimed in claim 22, wherein the video system is a mains-powered device.

25. A video system as claimed in claim 22, wherein the video system is an in-car, in-train, or in-plane entertainment system.

26. An audio amplifier circuit as claimed in claim 1 wherein the feedback loop comprises a digital-to-analog converter for receiving the output of the integrator and outputting the feedback signal.

27. An audio amplifier circuit comprising:
    a plurality of inputs, for receiving a plurality of input signals;
    a plurality of amplifiers, for receiving a corresponding plurality of modified input signals and outputting a corresponding plurality of amplified signals; and
    a feedback block, multiplexed across the plurality of amplifiers, for receiving each of the plurality of amplified signals and combining a corresponding one of a plurality of feedback signals with a corresponding one of the plurality of input signals to generate the plurality of modified input signals, the feedback block comprising:
       an analog to digital converter configured to convert a corresponding one of the plurality of amplified signals to a digital signal;
       a digital low-pass filter for filtering said digital signal produced by the analog to digital converter;

a comparator for comparing the filtered signal with a predetermined threshold value and outputting a comparison signal, wherein said predetermined threshold value represents a target DC offset value; and digital integrator for integrating the comparison signal and outputting a signal as the basis for a corresponding one of the plurality of feedback signals.

28. An audio amplifier circuit as described in claim 27, further comprising a plurality of latches for latching each of the corresponding feedback signals.

29. A method of amplifying an audio signal, comprising:
receiving an input signal;
receiving a modified input signal and outputting an amplified signal; and
feeding back the amplified signal via a digital feedback loop and combining a feedback signal with the input signal to generate the modified input signal, wherein the step of feeding back comprises:
converting the amplified signal into a digital signal;
digitally filtering the digital signal;
comparing the filtered digital signal with a predetermined threshold value and outputting a comparison signal, wherein the predetermined threshold value represents a target DC offset level;
integrating the comparison signal; and
using the integrated signal to provide the feedback signal.

30. A method as claimed in claim 29, wherein the step of feeding back comprises:
converting the amplified signal into a digital signal;
integrating the digital signal;
reducing the word length of the digital signal using a sigma-delta modulator; and
converting the integrated signal into an analog signal to output the feedback signal.

31. A method of amplifying a plurality of signals, comprising:
receiving a plurality of input signals;
receiving a corresponding plurality of modified input signals and outputting a corresponding plurality of amplified signals; and
feeding back each of the plurality of amplified signals and combining a corresponding one of a plurality of feedback signals with a corresponding one of the plurality of input signals to generate the plurality of modified input signals,
wherein said step of feeding back comprises:
converting a corresponding one of the plurality of amplified signals into a digital signal;
digitally filtering the digital signal;
comparing the filtered digital signal with a predetermined threshold value and outputting a comparison signal, wherein the predetermined threshold value represents a target DC offset level; and
integrating the comparison signal and outputting a corresponding one of the plurality of feedback signals.

32. An audio amplifier circuit as claimed in claim 31, wherein the feedback loop operates in one of a first mode and second mode.

33. An audio amplifier circuit as claimed in claim 32, wherein the feedback loop operates at a first clock frequency in the first mode and at a second clock frequency in the second mode.

* * * * *